United States Patent
Wilson

(10) Patent No.: US 9,054,649 B2
(45) Date of Patent: Jun. 9, 2015

(54) CROSSOVER PERFORMANCE OF POWER AMPLIFIER

(75) Inventor: Martin Paul Wilson, Cambourne (GB)

(73) Assignee: Nujira Limited (GB)

( * ) Notice: Subject to any disclaimer, the term of this patent is extended or adjusted under 35 U.S.C. 154(b) by 97 days.

(21) Appl. No.: 13/702,728

(22) PCT Filed: Jun. 13, 2011

(86) PCT No.: PCT/EP2011/059763
§ 371 (c)(1),
(2), (4) Date: Mar. 25, 2013

(87) PCT Pub. No.: WO2011/154549
PCT Pub. Date: Dec. 15, 2011

(65) Prior Publication Data
US 2013/0207724 A1    Aug. 15, 2013

(30) Foreign Application Priority Data
Jun. 11, 2010 (GB) .................................. 1009857.2

(51) Int. Cl.
*H03F 1/07*   (2006.01)
*H03F 3/26*   (2006.01)
*H03F 3/195*  (2006.01)
*H03F 3/30*   (2006.01)

(52) U.S. Cl.
CPC .............. *H03F 3/265* (2013.01); *H03F 3/195* (2013.01); *H03F 3/3028* (2013.01); *H03F 2203/30006* (2013.01); *H03F 3/26* (2013.01)

(58) Field of Classification Search
CPC .................................. H03F 1/07; H03F 1/0288
USPC .............. 330/274, 264, 295, 124 R, 285, 296
See application file for complete search history.

(56) References Cited

U.S. PATENT DOCUMENTS 4,593,251 A   6/1986  Smith
6,204,731 B1  3/2001  Jiang et al.
(Continued)

FOREIGN PATENT DOCUMENTS

EP    1515434 A1   3/2005
JP    56002714 A   1/1981

OTHER PUBLICATIONS

Mr. K. Sylvan, "GB Application No. GB1009857.2 Search Report", Oct. 1, 2010, Publisher: UK IPO, Published in: GB.
(Continued)

*Primary Examiner* — Henry Choe
(74) *Attorney, Agent, or Firm* — Kaplan Breyer Schwarz & Ottesen, LLP

(57) ABSTRACT

There is provided an amplifier arrangement comprising: a main amplifier connected to receive an input signal and generate an amplified version of the input signal; an additional amplifier, having a smaller geometry than the main amplifier, connected to receive the input signal and generate an amplified version thereof; and wherein the outputs of the main amplifier and the additional amplifier are combined to provide an amplified output.

20 Claims, 11 Drawing Sheets

Amplifier with feed forward bandwidth extension

(56) References Cited

U.S. PATENT DOCUMENTS

| | | |
|---|---|---|
| 6,215,356 B1 | 4/2001 | Servaes et al. |
| 6,310,520 B1 | 10/2001 | Walden |
| 6,717,470 B1 | 4/2004 | Bowers |
| 6,788,147 B1 | 9/2004 | Lubbers |
| 7,362,175 B2 * | 4/2008 | Arques .................. 330/264 |
| 7,936,217 B2 * | 5/2011 | Deng et al. ............. 330/264 |
| 8,138,835 B2 * | 3/2012 | Zeng et al. ............. 330/296 |
| 2007/0298736 A1 | 12/2007 | Fujioka et al. |
| 2009/0058523 A1 | 3/2009 | Ogata |

OTHER PUBLICATIONS

Ghilini, Marie, "International Application No. PCT/EP2011/059763 International Search Report and Written Opinion", Nov. 18, 2011, Publisher: PCT, Published in: EP.

Stefen Dietsche, "Related International Application No. PCT/EP2011/059763 International Preliminary Report on Patentability and Written Opinion of the International Searching Authority", Dec. 27, 2012, Publisher: PCT.

* cited by examiner

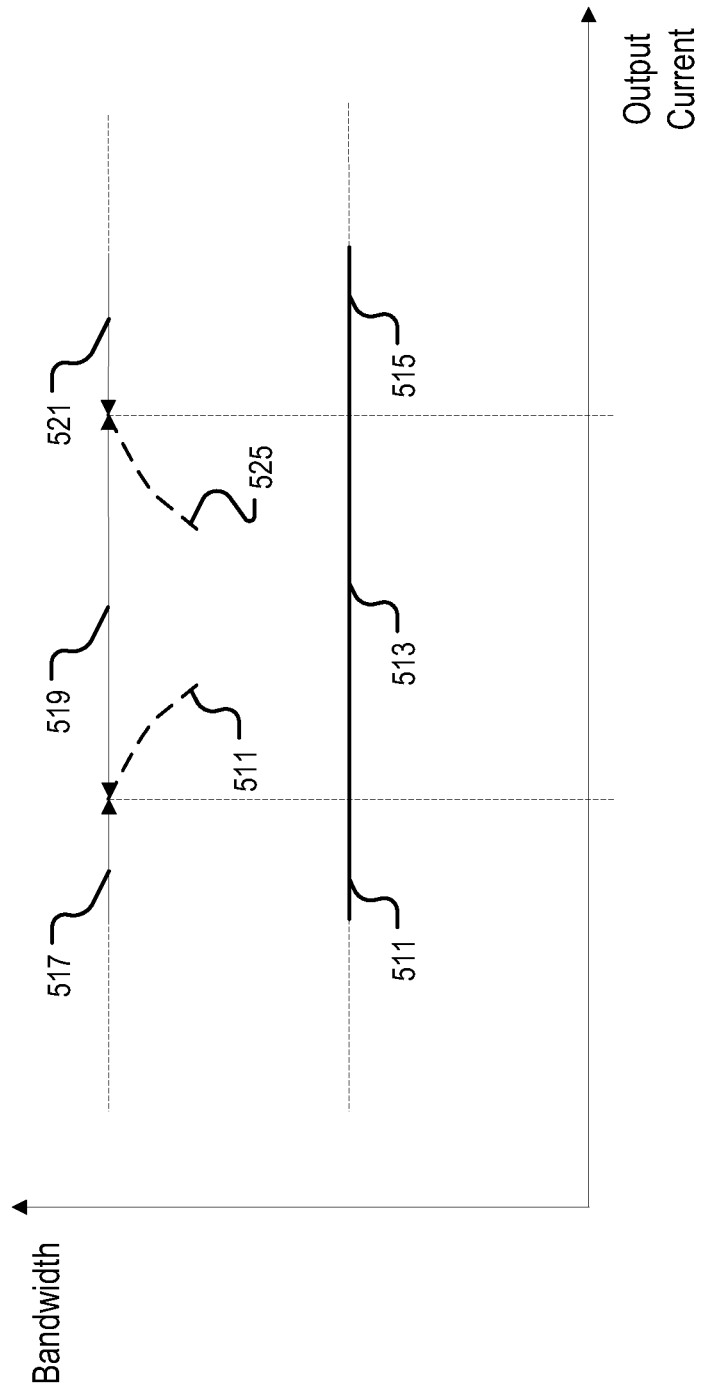

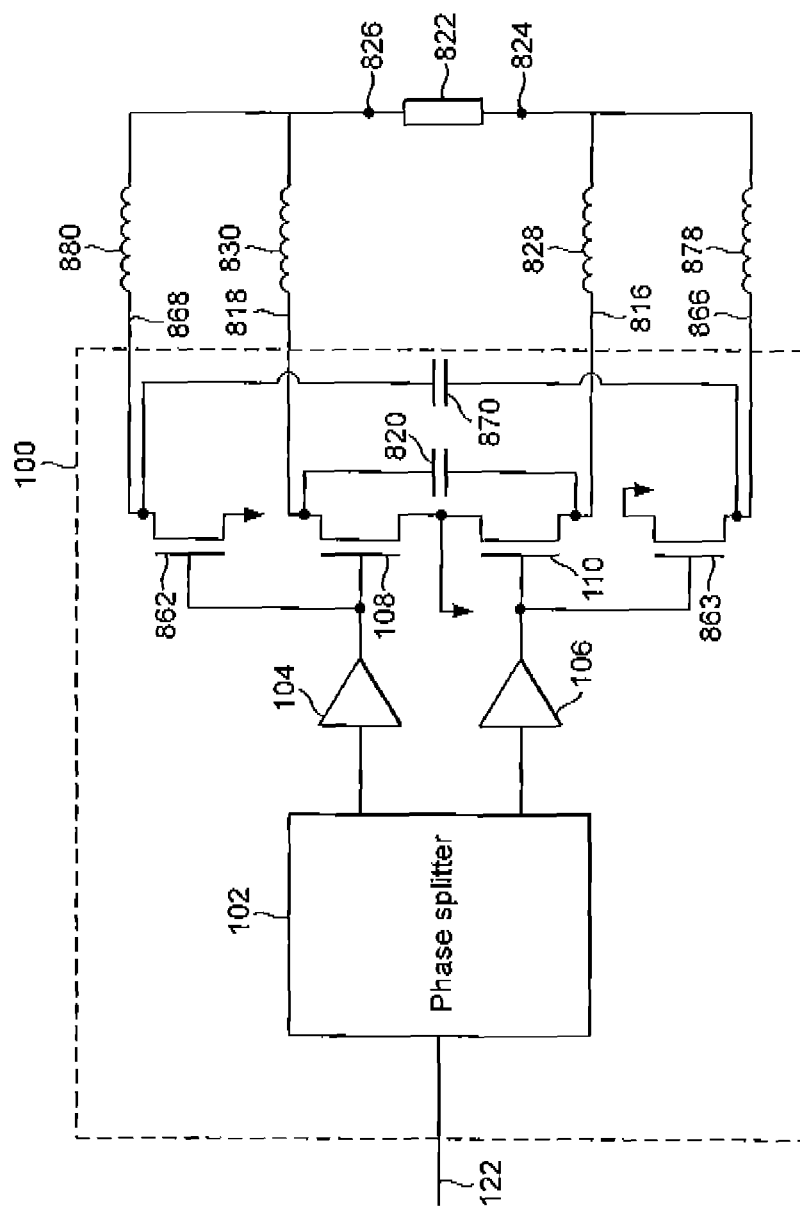

CROSSOVER PERFORMANCE OF POWER AMPLIFIER

BACKGROUND TO THE INVENTION

1. Field of the Invention

The present invention relates to amplifiers that amplify signals having a high peak-to-mean output current ratio, particularly to amplifiers providing a so-called push-pull arrangement, and particularly but not exclusively to Class AB amplifiers.

2. Description of Related Art

With amplifiers, such as Class AB amplifiers, that amplify signals that have a high peak-to-mean output current ratio, it is important to maintain a low quiescent current, otherwise the amplifier will show poor efficiency.

Existing typical class AB amplifier architectures run a quiescent current that is a significant fraction of the peak output current, so as to avoid a collapse in bandwidth in the crossover region. This results in either oscillation or significant distortion when operating in the crossover region.

It is an aim of the invention to provide an improved amplifier architecture which addresses the above problems.

SUMMARY OF THE INVENTION

In one aspect the invention provides an amplifier arrangement comprising: a main amplifier connected to receive an input signal and generate an amplified version of the input signal; an additional amplifier, having a smaller geometry than the main amplifier, connected to receive the input signal and generate an amplified version thereof; and wherein the outputs of the main amplifier and the additional amplifier are combined to provide an amplified output. The main amplifier comprises a push-pull amplifier. During operation in a crossover region of the main amplifier, the bandwidth of the additional amplifier is greater than the bandwidth of the main amplifier.

The additional amplifier may correspond to one part of the push-pull main amplifier, and the output of the additional amplifier may be combined with the output from one part of the push-pull main amplifier.

The additional amplifier may be a push-pull amplifier.

During operation in the crossover region of the main amplifier, the bandwidth of the main amplifier may be reduced compared to the bandwidth of the main amplifier during operation outside the crossover region.

During operation, when the bandwidth of the main amplifier is reduced, the bandwidth of the additional amplifier may be greater than the bandwidth of the main amplifier.

During operation, when the bandwidth of the main amplifier is reduced, the bandwidth of the additional amplifier may be maintained at a level corresponding to the bandwidth of the main amplifier before the bandwidth of the main amplifier was reduced.

The bias current of the main amplifier may be set in dependence on a level of bias current required to provide a required bandwidth outside a crossover region of operation. The bias current of the main amplifier may be set independent of a level of bias current required to provide a required bandwidth outside a crossover region of operation.

The bias current of the main amplifier may be set in dependence on a level of bias current to achieve a desired bandwidth of operation with an output transistor of the push or pull side of the amplifier fully turned on. The bias current of the main amplifier may be set independent of a level of bias current to achieve a desired bandwidth of operation with an output transistor of the push or pull side of the amplifier fully turned on.

The amplifier may further comprise a high pass filter connected to receive the input signal and provide a high pass filtered version of the input signal as the input to the additional amplifier.

The additional amplifier may increase the overall bandwidth of the amplifier arrangement, during a period in which the bandwidth of the main amplifier is reduced, such that the phase shift between the input and the output is reduced relative to the phase shift between the input and output of the main amplifier.

The additional amplifier may increase the overall bandwidth of the amplifier arrangement, during a period in which the bandwidth of the main amplifier is reduced, such that the bandwidth of the main amplifier is reduced relative to the bandwidth of the main amplifier without the additional amplifier, wherein the bias current of the main amplifier is reduced relative to the bias current of the main amplifier without the additional amplifier.

The main amplifier may be a power amplifier.

The main amplifier may comprise a current mirror arrangement for driving an output transistor.

The main amplifier and the additional amplifier may be provided on an integrated circuit, and the output of each amplifier is connected to a respective bond wire of the integrated circuit. The output of each amplifier may be connected to a respective bond wire of the integrated circuit for connection off-chip. The respective outputs may be combined off-chip.

In another aspect the invention provides a method of amplifying an input signal comprising: amplifying the input signal in a main amplifier to generate an amplified version of the input signal; amplifying the input signal in an additional amplifier, having a smaller geometry than the main amplifier, to generate an amplified version thereof; and combining the amplified versions of the input signal to provide an amplified output. The main amplifier comprises a push-pull amplifier. During operation in a crossover region of the main amplifier, the bandwidth of the additional amplifier is greater than the bandwidth of the main amplifier.

The method may further comprise the step of providing a bias current for the main amplifier determined in dependence on a predetermined bandwidth of operation of the main amplifier.

In any region of operation of the main amplifier, for the determined bias current, where the bandwidth of operation of the main amplifier is reduced, the bandwidth of operation of the additional amplifier may provide for full bandwidth operation.

The method may further comprise a bias current for the additional amplifier which is less than the bias current for the main amplifier, determined in dependence on a predetermined bandwidth of operation for the additional amplifier which corresponds to the bandwidth of operation of the main amplifier.

The bias current of the main amplifier may be reduced compared to the bias current required for the main amplifier if the additional amplifier was not provided.

The main amplifier may be a push-pull amplifier including complementary output transistors, wherein the bias current is determined in dependence on the bias current required to achieve the predetermined bandwidth with either output transistor turned on.

The method may further comprise the step of high pass filtering the input signal before applying to the input of the additional amplifier.

The additional amplifier preferably maintains the overall bandwidth of the amplification stage at any point at which the bandwidth of the main amplifier is reduced, or reduced below a pre-determined level, by providing for the amplification of signals at such point. Preferably, the additional amplifier provides for amplification of the high frequency components of the signal to be amplified.

The main amplifier and the additional amplifier may be provided on an integrated circuit, the method further comprising connecting the output of each amplifier to a respective bond wire of the integrated circuit. The method may further comprise connecting a respective bond wire of the integrated circuit for connection off-chip. The respective outputs may be combined off-chip.

BRIEF DESCRIPTION OF THE FIGURES

The invention will now be described by way of example with reference to the accompanying figures, in which:

FIG. 10 illustrates the connection of an output amplifier to an off-chip load in accordance with an embodiment of the invention.

DESCRIPTION OF THE PREFERRED EMBODIMENTS

The invention is described herein by way of particular examples and specifically with reference to preferred embodiments. It will be understood by one skilled in the art that the invention is not limited to the details of the specific embodiments given herein. In particular the invention is described herein by way of reference to a Class AB amplifier. However more generally the invention may apply to any push-pull amplifier arrangement where it is desirable to provide either a reduction in bias (Quiescent) current in a crossover region, or a reduction in phase shift between the input and output of the amplifier in a crossover region.

The invention is applicable to a so-called push-pull amplifier, i.e. an amplifier which can drive either a positive or negative current into a load, or put another way source current to or sink current from a load. In push-pull arrangements, it is well-known to define a crossover period in which period current is, at least partially, both sourced to and sunk from a load. The invention, and its embodiments, offers particular advantages to a push-pull amplifier when operating in its crossover region.

The invention as described herein is particularly advantageous when applied to an RF amplification stage of a portable device, such as a portable device including telephony functionality.

In preferred embodiments, the invention provides a modification to a high bandwidth class AB amplification stage that: (i) allows use of a bias (Quiescent) current for an amplifier of the amplification stage that can be a tiny fraction (e.g. $100^{th}$) of the peak output current, and much reduced in comparison with the bias current required in prior art arrangements; and/or (ii) allows the phase shift of the amplification stage to be reduced in comparison with prior art arrangements.

The class of amplifier this invention pertains to is preferably those that use current mirrors—rather than miller-compensated amplifiers—to maintain high power bandwidth. However the invention is also advantageously applicable to miller-compensated amplifiers and any other type of amplifier.

For the purposes of an illustrated example, the theory of the invention is described in the context of its applicability to a Class AB amplifier utilising current mirrors, but one skilled in the art will appreciate that the invention is more generally applicable to other types of amplifier.

The description that follows is for illustrative purposes so the behaviour is much simplified. However the principles are generally applicable to any type of system.

Figure 1:
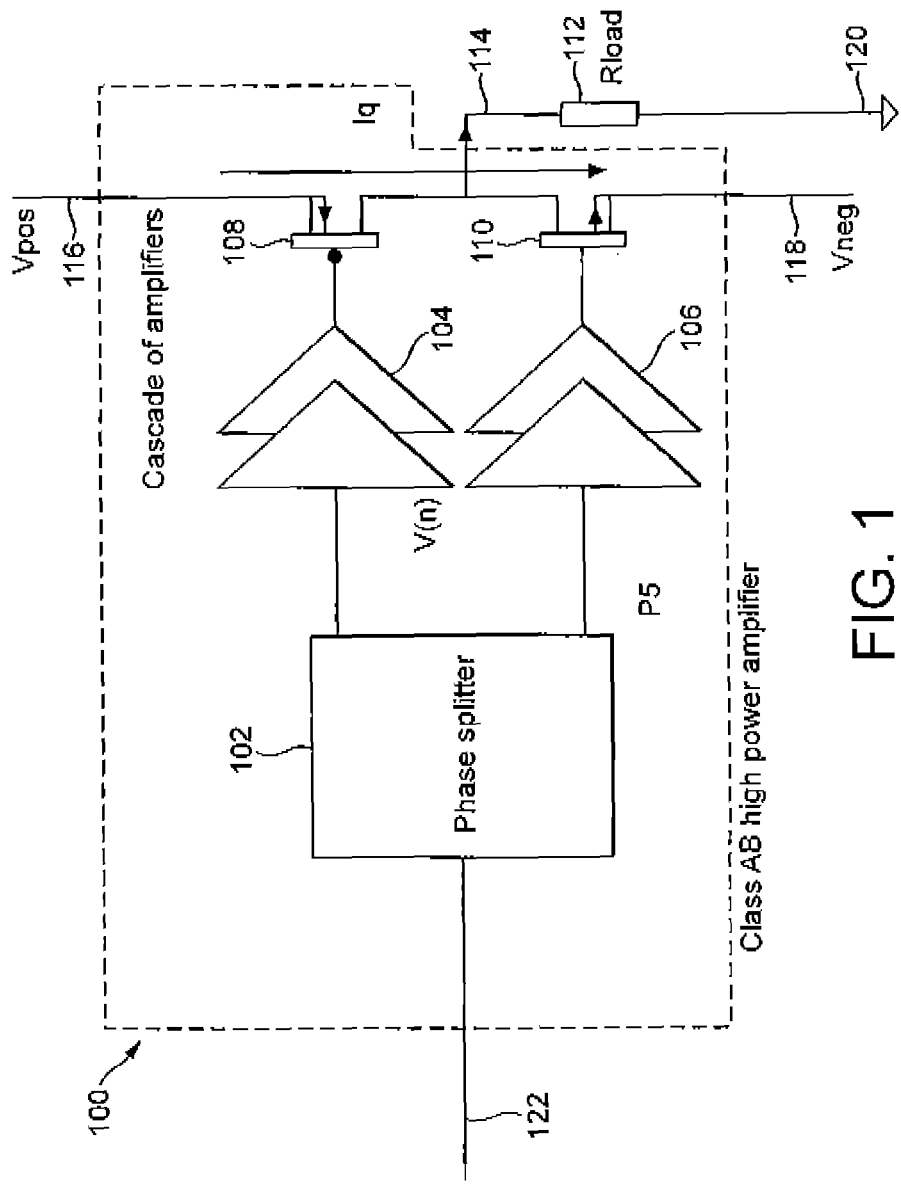
FIG. 1 illustrates a block diagram of a prior art class AB power amplifier.

FIG. 1 shows a block diagram of an exemplary class AB power amplifier 100. The Class AB amplifier 100 includes a phase splitter 102, an amplification stage 104, an amplification stage 106, a p channel MOSFET 108, and an n channel MOSFET 110. The input of the Class AB amplifier on line 122 is provided to the phase splitter 102. The output of the Class AB amplifier on line 114 is delivered to one terminal of a load 112, which has a further terminal connected via a line 120 to electrical ground. A positive power supply is provided on line 116 to the p channel MOSFET 108, and a negative power supply is provided on line 118 to the n channel MOSFET 110.

The architecture of a Class AB amplifier as illustrated in FIG. 1, and the theory of its operation, is well-known to one skilled in the art.

The input on line 102 is phase split by the phase splitter 102. One phase of the input is provided as an input to the upper amplification stage 104, which may be comprised of a number of amplifiers, which controls the upper p channel MOSFET output transistor device 108 (or equivalent PNP device) to source current into the load 112. Another phase of the input is provided as an input to the lower amplification stage 106, which may be comprised of a number of amplifiers, which controls the lower n channel MOSFET output transistor device 110 (or equivalent NPN device) to sink current from the load.

Figure 2:
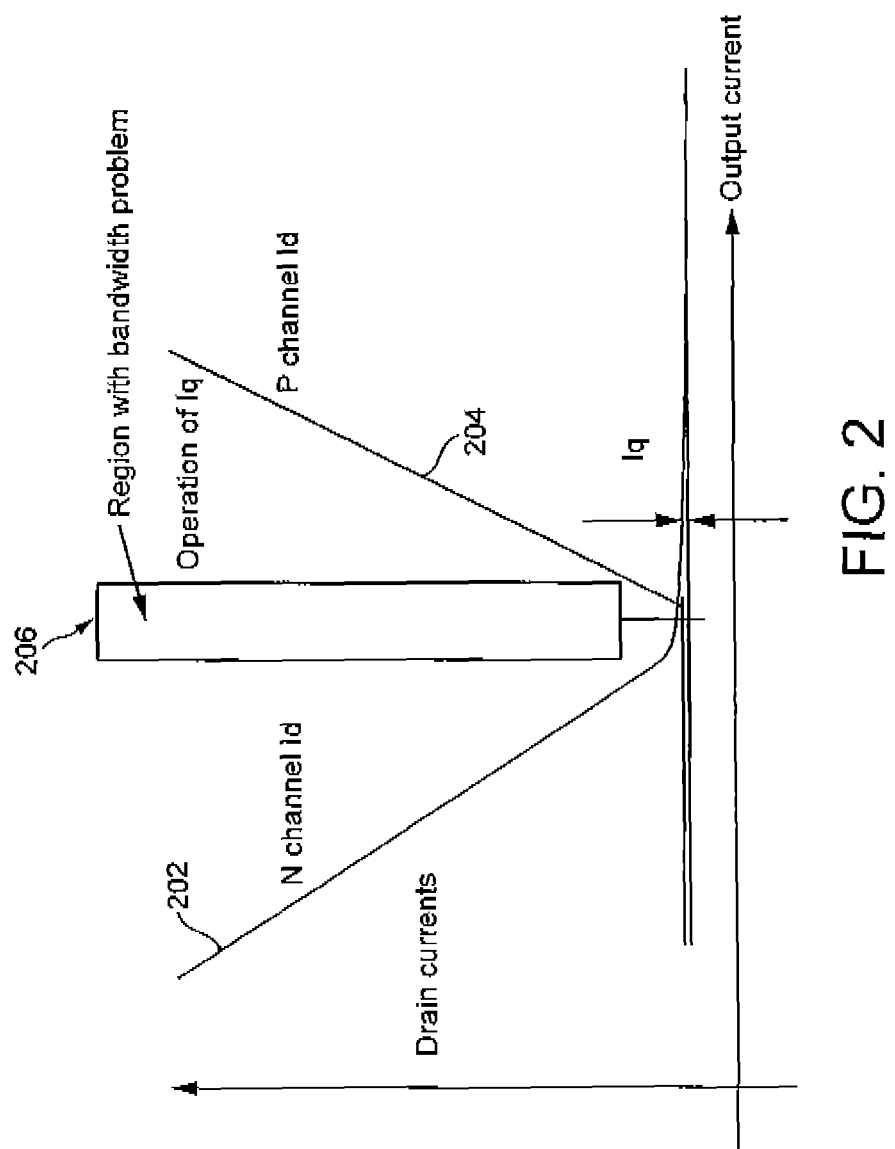
FIG. 2 illustrates a plot of drain current against output current for the class AB amplifier of FIG. 1.

FIG. 2 shows a plot of drain current against output current for the output transistors 108 and 110 of FIG. 1. Reference numeral 202 identifies the plot of the drain current in the output transistor 110 which sinks current (the n channel MOSFET 110). Reference numeral 204 identifies the plot of the drain current in the output transistor 108 which sources current (the p channel MOSFET 108). As the output current increases, the drain current of the sink transistor decreases, until a point is reached at which it plateaus toward a minimum level. At the time the drain current of the sink transistor plateaus at a minimum level, the drain current of the source transistor increases from a plateaued minimum level. Thus there is a cross-over region where there is a transition of the current delivered to the output from one active element (i.e. output transistor) to the other. This crossover region is denoted in FIG. 2 by the shaded region 206. In the crossover region, at a time when one transistor is turning 'on' and the other is turning 'off', in the centre of FIG. 2 as denoted by reference numeral 206, both the p and n channel MOSFET transistors 108 and 110 simultaneously have low drain currents.

The plot of output current against drain currents illustrated in FIG. 2, and the existence of the crossover region 206, is well-known in the art.

FIGS. 3(a) and 3(b) show a representation of one half of the output stage of the amplifier of FIG. 1. In the example of FIGS. 3(a) and 3(b), the upper half of FIG. 1, namely the amplification stage 104 and transistor 108, are illustrated.

FIG. 3(a) denoted by reference numeral 302, shows a current mirror arrangement. A transistor 306 is arranged as a current mirror. The drain path of the transistor 306 is connected between the input on line 316 (from the phase splitter—not shown), and a supply voltage on line 318 denoted V(n). The gate of the transistor 306 is connected to the drain of the transistor 306. The gate of the transistor 306 is connected to the gate of a transistor 308, and the transistor 308 has its drain path connected between an output on line 320 and the supply voltage on line 318 denoted V(n). As one skilled in the art will understand, the output current formed on the output line 320 (which is delivered to a load—not shown) is controlled by the current mirror arrangement of the transistors 306 and 308 to be a scaled version of the input current on line 316.

FIG. 3(b) denoted by reference numeral 304 shows a simplification of the current mirror arrangement 302 of FIG. 3(a), whereby the reference side of the current mirror is replaced by a resistor 310 of equivalent value, 1/gm1 (where gm1 is the transconductance of the current mirror transistor 306). The transconductance of the transistor 308 is denoted by gm. Typically, the ratio gm/gm1 is the current multiplication ratio of the output stage. The resistor 310 is connected between the input on line 322 (from the phase splitter—not shown), and the supply voltage on line 318 denoted V(n). The input to the resistor on line 322 is additionally connected to the gate of the transistor 312, which corresponds to the transistor 308. The input on line 322 is also connected to the drain of the transistor 312 via a capacitor 314, which has a value Cg being the gate drain capacitance of the transistor 312. The transistor 312 is equivalent to the output transistor 108 of FIG. 1.

The stage 304 of FIG. 3(b) is illustrated as an equivalent to the stage 302 of FIG. 3(a), as the theory of operation can be more easily expressed with reference to the equivalent stage 304 than the current mirror stage 302. FIG. 3(b) is a simplified equivalent circuit of FIG. 3(a).

The current gain ratio of the stage 304 shown in FIG. 3(b) is:

$$H(s) = \frac{-r_g g_m + r_g s c_g}{1 + r_g s c_g} \quad \text{[Equation 1]}$$

Where: $r_g$ is the resistance of the resistor 310, $g_m$ is the transconductance of the transistor 312; $c_g$ is the gate capacitance of the transistor 312 (denoted as 314 in FIG. 3), and s is the complex radian frequency jw.

A pole in the amplifier 100 of FIG. 1 exists at a frequency $w=1/(r_g s_g)$. However at a frequency $r_g g_m$ above this, the main amplifier frequency becomes unity and frequency independent. However, the phase becomes reversed resulting in the presence of a right hand plane (rhp) zero. Because the gain rises and the phase falls, a usual pole zero compensation means cannot be applied. When the current is at a high level, this zero is normally high enough in frequency to avoid a serious problem. However, at low currents—such as occur during and around the crossover period—the current can fall to $1/100^{th}$ of the peak output, resulting in the transconductance $g_m$ falling to $1/10^{th}$ of its high current value. However, the capacitance Cg remains approximately constant, with the result that the RHP zero reduces phase margin in the crossover region. This is illustrated in FIG. 4.

Figure 4:
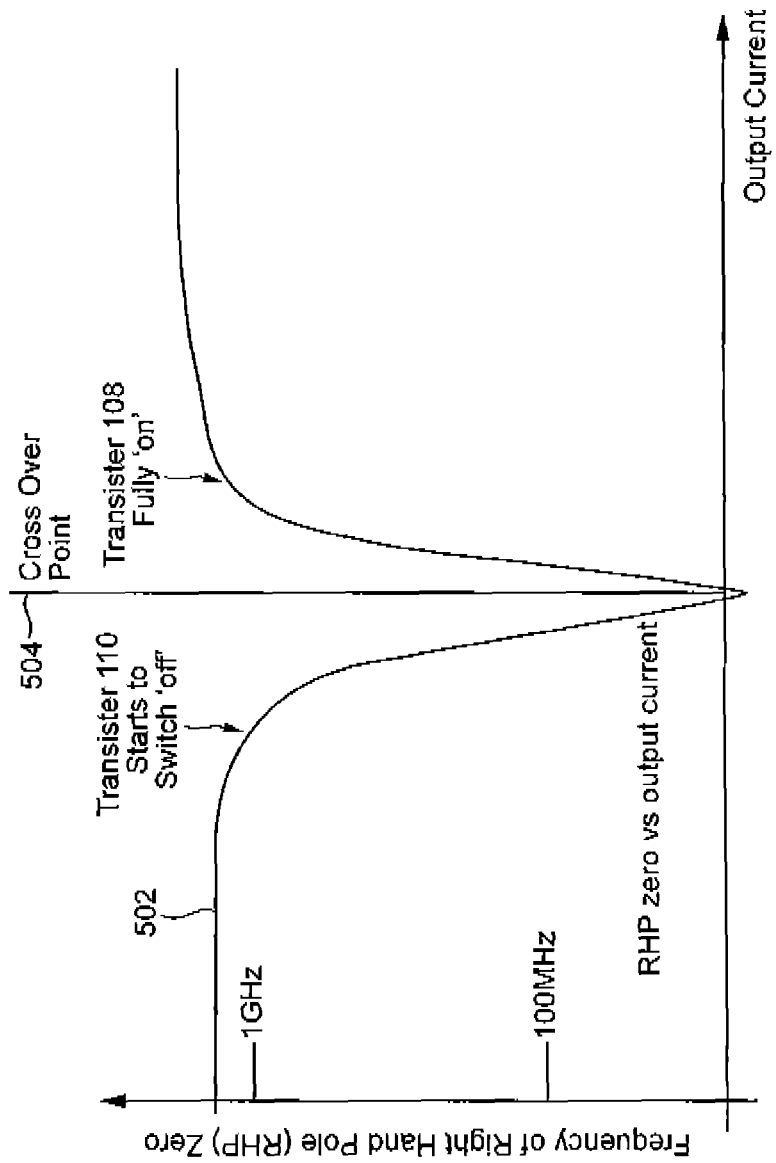
FIG. 4 illustrates a plot of right hand pole zero frequency against output current for the amplifier arrangement of FIG. 1.

FIG. 4 illustrates a plot of RHP zero frequency against output current for the amplifier arrangement of FIG. 1. The line 504 represents the crossover point. As can be seen in FIG. 4, the RHP zero frequency reduces significantly in and around the crossover region, with a maximum reduction at the crossover point represented by line 504.

Thus, as illustrated in FIG. 4, in the crossover region, where output current is reduced, the drop or reduction in the right hand phase zero reduces phase margin.

Figure 5:
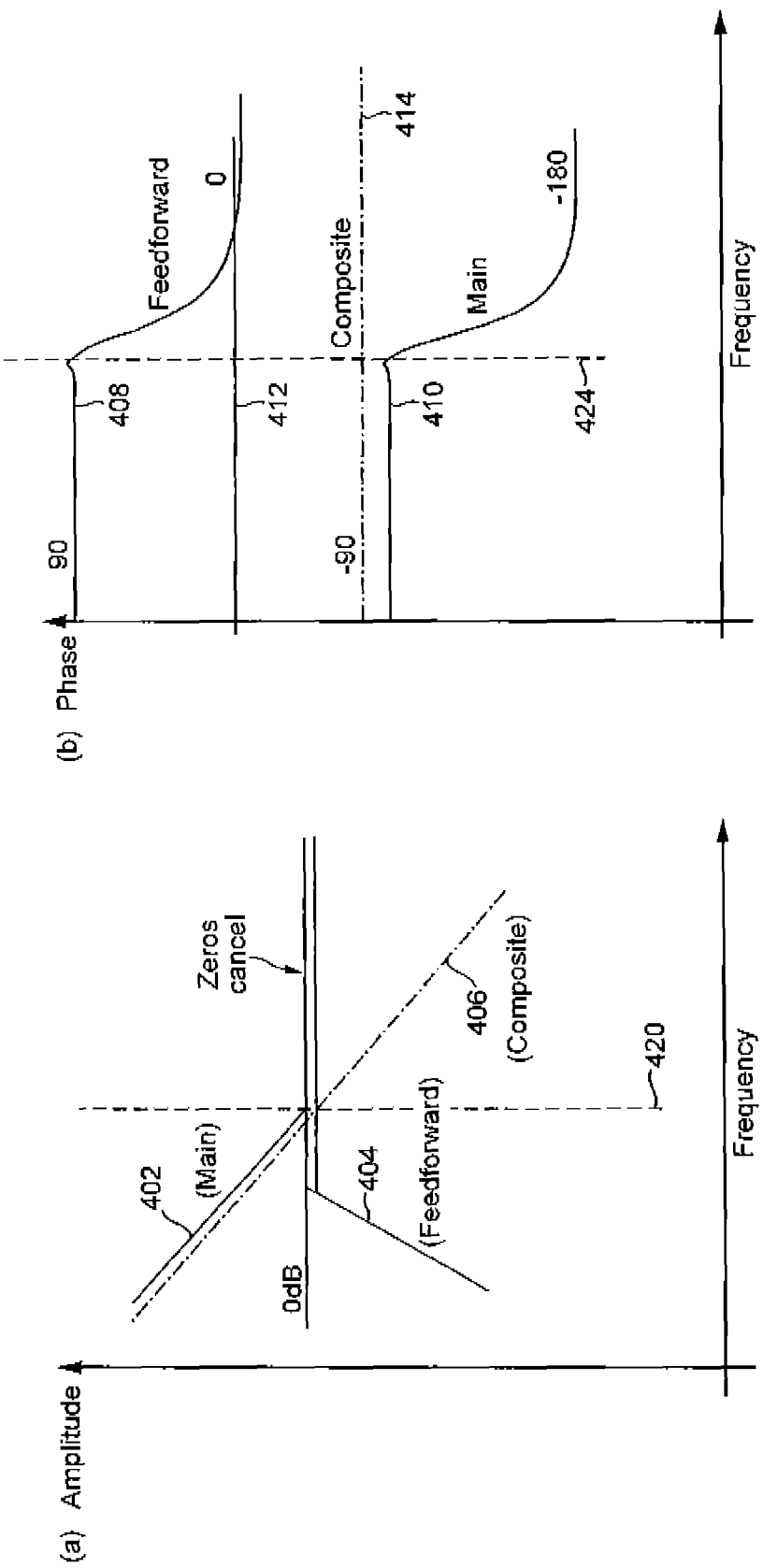
FIGS. 5(a) and 5(b) illustrate the response of the output current gain as plots of amplitude against frequency and phase against frequency for the amplifier of FIG. 1.
FIG. 5(c) illustrates an example plot of bandwidth against output current.

The response of the output current gain is illustrated in FIG. 5.

FIG. 5(a) illustrates the magnitude of the response, and is a plot of output current amplitude (y-axis) against frequency (x-axis). FIG. 5(b) illustrates the phase of the response and is a plot of output current phase (y-axis) against frequency (x-axis).

In FIG. 5(a), the plot 402 illustrates the magnitude of response against frequency for the prior art amplifier 100 of FIG. 1. In FIG. 5(b), the plot 410 illustrates the phase of the response against frequency in the prior art amplifier 100 of FIG. 1.

As can be seen in FIG. 5(a), after the zero-frequency point (RHP zero), denoted by dash line 420, the amplitude of the zeros are approximately equal.

As can be seen in FIG. 5(b), the zero-frequency point is denoted by dash line 424. After the zero frequency point, the phase becomes opposing (i.e. is inverted). A different means of providing compensation is therefore required in order to provide improved performance.

Figure 3:
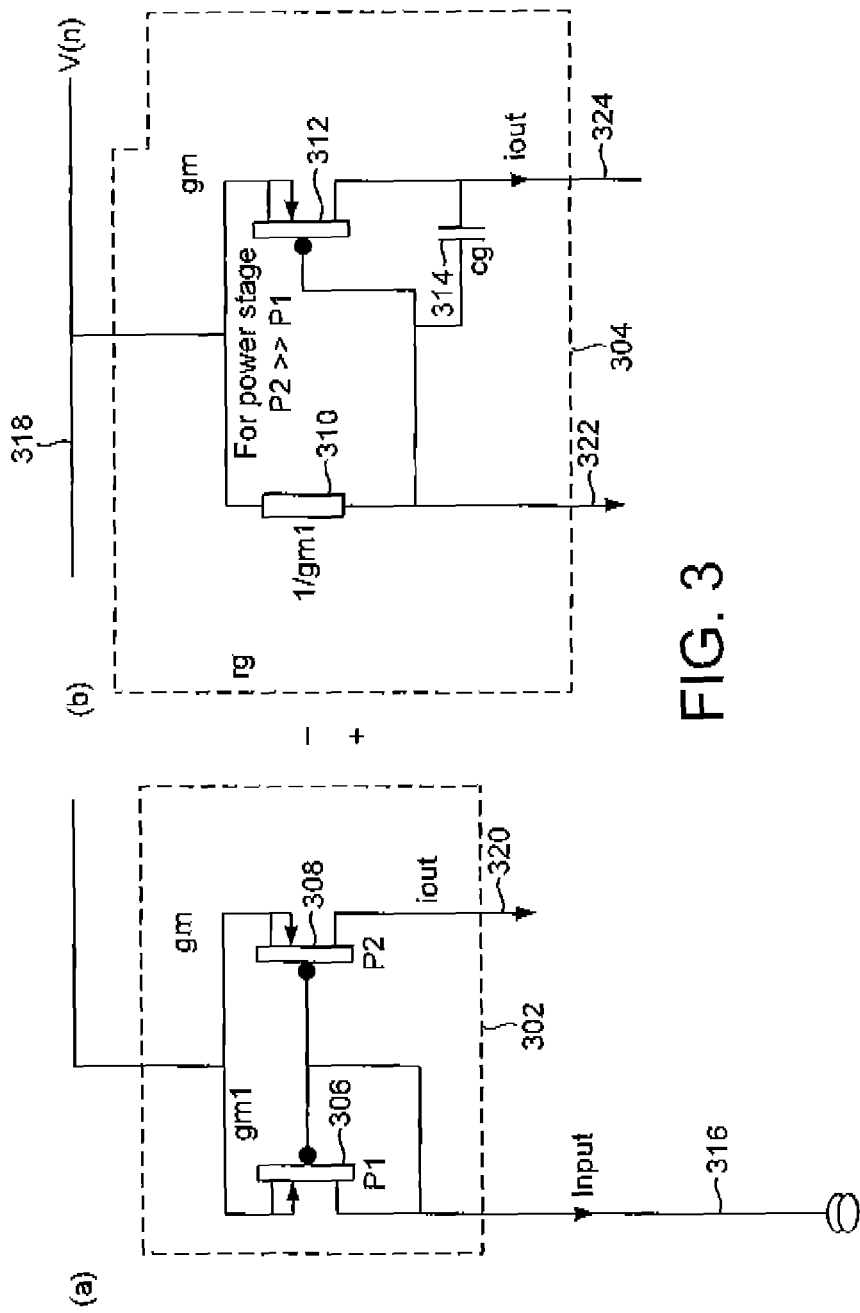
FIGS. 3(a) and 3(b) show representations of one half of the output stage of the amplifier of FIG. 1.

The phase inversion described above with reference to the plot 410 to FIG. 5(b) is the result, in the illustrative example, of signals feeding forward through the gate drain capacitance Cg (illustrated in the equivalent circuit of FIG. 3). Existing mitigation techniques for the RHP zero involve placing circuits in the feed-forward path that result in phase inversion, to block signal flow in the forward direction. However, if the gate drain capacitance Cg is physically part of the output transistor, this is not possible.

The method, in accordance with the invention, is to cancel the unwanted feed-forward path by feeding forward a similar amplitude signal which is opposite in phase. When this happens, the RHP zero is cancelled and the amplifier reverts to a single pole roll-off.

The operation and effect of the invention in an idealised case is illustrated with further reference to FIGS. 5(a) and 5(b).

In FIG. 5(a) there is further illustrated a plot 404 of the magnitude of a feed-forward signal in accordance with an embodiment of the invention. In FIG. 5(b) there is further illustrated a plot 408 of the phase of the feed-forward signal in accordance with an embodiment of the invention.

As illustrated, at high frequencies the magnitude of the feed-forward signal is approximately the same as the magnitude of the normal amplified signal of FIG. 1, shown as plot 402 in FIG. 5(*a*). As a result of combining the feed-forward signal 404 with the normal amplified signal 402, a composite signal is obtained as illustrated by plot 406.

As illustrated, the phase of the feed-forward signal is the inverse of the phase of the normal amplified signal of FIG. 1, shown as plot 410 in FIG. 5(*b*). As a result of combining the feed-forward phase 408 with the normal amplified signal phase 410, a composite phase signal is obtained as illustrated by plot 414. This shows that as a result of the feed-forward signal, the phase of the composite signal 414 is unchanged before and after the crossover point 424.

In summary, the main amplifier response 402 flattens out, but the phase shift 410 continues to 180 degrees. The feed-forward path response 404 rises at 6 dB/octave from the zero at DC, until it reaches the single pole at 1/cpri. The feed-forward phase response 408 starts at 90 degrees and asymptotes towards zero degrees. The composite response 406 shows a single pole roll off and a constant phase shift 414 of −90 degrees.

The means to provide this cancellation as described above may be referred to as a feed-forward amplifier. In general, exact cancellation is not required. In general the gain of the feed-forward amplifier is arranged to be greater than the gain from feed-through of the output signal from the gate capacitance of the output transistor 312, Cg.

Figure 6:
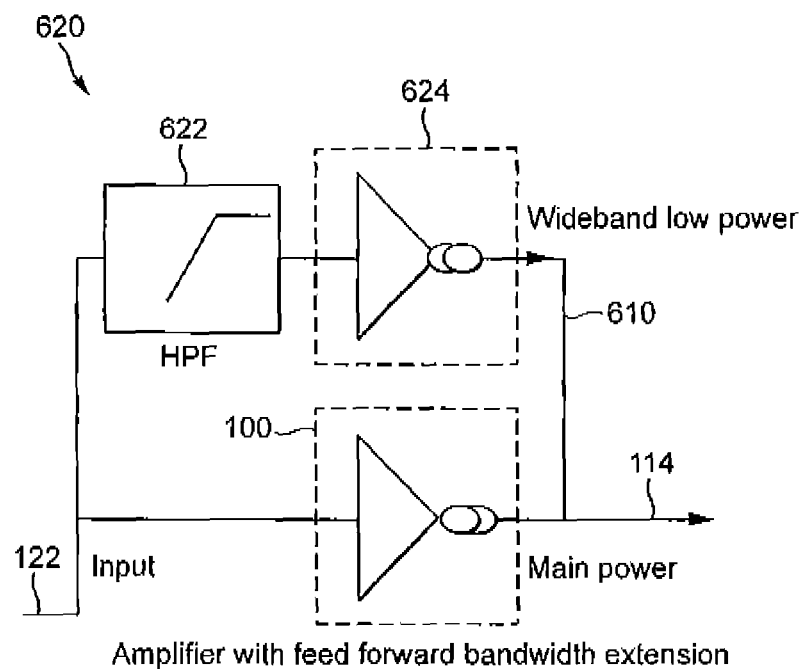
FIG. 6 illustrates an exemplary implementation of an improved amplification stage in accordance with the invention.

FIG. 6 shows an exemplary practical implementation of the above described inventive proposal. The adapted amplifier arrangement 620 includes a power amplifier arrangement 100 corresponding to the power amplifier arrangement 100 of FIG. 1. It will be understood that this is an exemplary illustration of a power amplifier arrangement, and the invention is not limited in its applicability to the specific arrangement 100 of FIG. 1. In general, the power amplifier arrangement 100 may be referred to as a main amplifier.

The adapted power amplifier arrangement further includes an optional high pass filter 622, and a small, wideband, low-power, feed-forward amplifier arrangement 624 in accordance with the inventive principles and embodiments. The amplifier arrangement 624 may be generally referred to as an additional amplifier.

The main signal path links directly from the composite input signal on line 122 to the output on line 114, via the main amplifier 114.

In parallel with this main signal path, in accordance with the invention, is the feed-forward path which may be generally referred to as an additional path. The high pass filter arrangement 622 provides a high frequency path to the additional amplifier 624.

The additional amplifier 624 is preferably a similar, but scaled down (i.e. geometrically smaller), version of the main amplifier 100, designed to run at a bias (Quiescent current) that is higher relative to its peak output current than the main amplifier's bias (Quiescent) current.

The additional path is needed on one side of the power amplifier only, not both sides. That is, with reference to FIG. 1, the additional path may be provided around one or other of the amplifier stages 104 and 106.

FIG. 5(*c*) illustrates the effect on bandwidth in the crossover region. FIG. 5(*c*) is an example plot of bandwidth against output current in an arrangement comprising the push-pull amplifier and the additional amplifier.

As the output current rises, in a region 517 before the crossover region, the bandwidth is provided at a predetermined level by the main amplifier as denoted by waveform plot 511. In the crossover region 519 the bandwidth is maintained, as denoted by waveform plot 513, by the additional amplifier which provides the bandwidth at the same predetermined level as the main amplifier did before crossover. As the output current continues to increase in a region 521 beyond the crossover region, the bandwidth as denoted by waveform plot 515 is again provided by the main amplifier at the predetermined level.

Thus outside the crossover region the bandwidth is provided at the predetermined level by the main amplifier, and in the crossover region 519 the bandwidth is maintained at the predetermined level by the additional amplifier. In the crossover region 519 the bandwidth of the main amplifier drops, as denoted by dashed line waveforms 523 and 525.

Figure 7:
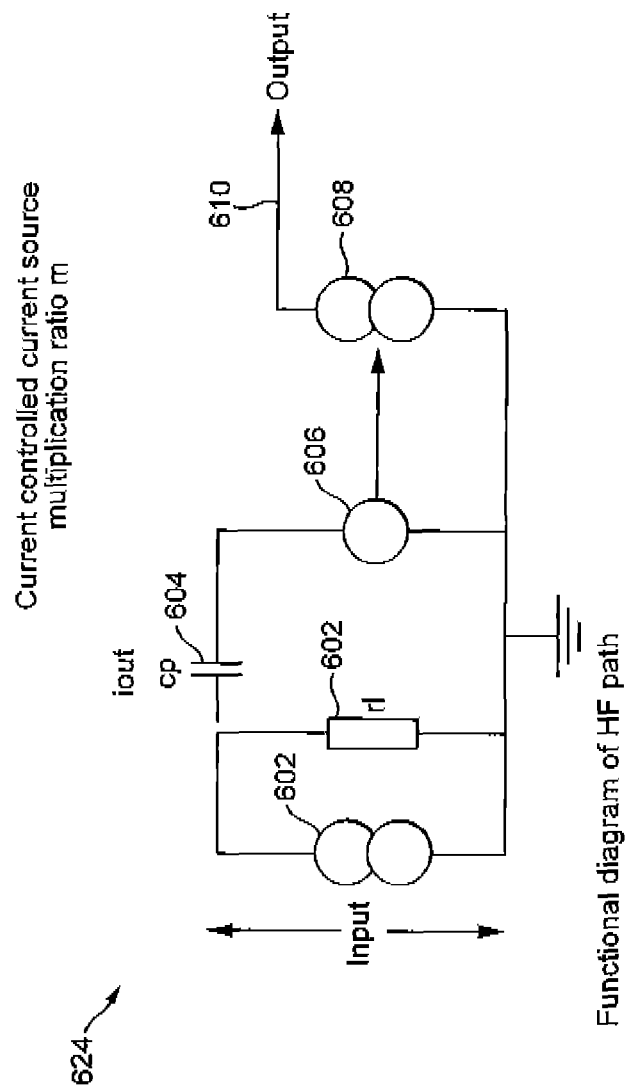
FIG. 7 illustrates an equivalent circuit of part of the improved amplification stage of FIG. 6.

A simplified response of a suitable additional amplifier 624 for providing cancellation in accordance with an embodiment can be modelled, as shown in FIG. 7, as a current controlled current source having a multiplication ratio of m. The model of the additional amplifier 624 includes a current source 602 which provides an input, a resistor 602 connected in parallel across the current source, a capacitor 604 connected in series with the current source and the resistor 602, a control element 606 connected in parallel with the resistor 602 and capacitor 604, and connected to control a current source 608 for generating an output signal 620, which forms the output of the amplifier arrangement 624.

The output of the additional amplifier arrangement 624 is combined with the output of the main amplifier 100 on line 114. Preferably, the combining comprises current combining.

The response of the example of the feed-forward amplifier 624 illustrated in FIG. 7 can be represented as:

$$H(sf\!f) = a\left(\frac{-sc_p}{r_l + sc_p}\right) \qquad \text{[Equation 2]}$$

In Equation 2, at high frequencies the gain will be asymptotic towards a, but the phase will be in opposition to that in Equation 1. Therefore, this satisfies the requirements for cancellation of the unwanted feed-forward path that provides the right hand pole zero. The result of this is that the zero terms will cancel leaving the single pole roll-off.

The additional amplifier is preferably designed to have a high pass function so that it does not need the same dynamic range as the main amplifier when amplifying a band-limited signal. There are two consequences of this:

a) The Quiescent current-to-peak current ratio of the high frequency path can be made much lower than otherwise possible, so the right hand zero problem is eliminated.

b) Cascaded lower voltage devices can be used. These devices have much better high frequency response, but do not have the current delivery capability of the main amplifier.

As described above, with reference to illustrative examples, the gate capacitance of the main amplifier results in a problem which the invention and its embodiments overcome. However this is only one illustrative example. The problems which the invention and its embodiments overcome may arise for different or additional reasons. A gate capacitance is one example of a characteristic which slows the speed of operation down.

In summary, one problem in the prior art is that the fixed bias current for the amplifier is chosen to be of a sufficiently high level to maintain the bandwidth performance of the amplifier in the crossover region. As discussed above, in the crossover region, or in general at a time when the drain currents of the output transistors are low, the bandwidth of the amplifier will be reduced. To compensate for this, a much higher fixed bias current is provided for the amplifier than is otherwise needed outside the crossover region.

Embodiments of the invention provide the advantage of reducing the bias current.

More particularly, the bias current of the main amplifier can be reduced. Any reduction in bias current is a benefit. The reduction in bias current in the main amplifier is a result of providing the additional amplifier. The additional amplifier has a smaller geometry than the geometry of the main amplifier, and hence the devices comprising the additional amplifier are smaller than the devices comprising the main amplifier. The smaller devices in the additional amplifier may provide for a reduction in the bias current of the main amplifier, because the bandwidth of the main amplifier may be reduced as the bias current is reduced. In practice, a reduction of 1/10 in the size of the amplifier gives a reduction of 1/100 in the bias current.

The bias current of an amplifier controls the bandwidth of the amplifier. The bias current is therefore set according to the bandwidth required for the amplifier. The bias current is therefore controlled according to the bandwidth performance required. Where the additional amplifier is provided, in accordance with the invention and its embodiments, the bias current of the main amplifier can be reduced compared to the prior art, because the bandwidth of the main amplifier can be reduced in the crossover region, because the additional amplifier provides wideband operation in the crossover region. The additional amplifier does not require a large bias current because of its small size.

The beneficial effect of a reduced bias current on the main amplifier is achieved by being able to provide—at the design stage—for a reduced bias current because of the provision of the additional amplifier. The bias current of the main amplifier may be set based on its requirement for operation outside the crossover region.

The bias current of the additional amplifier is lower than that required—in the prior art—for the main amplifier during the crossover period, because the smaller geometry of the additional amplifier requires less current. The smaller geometry of the additional amplifier is permitted because it preferably is not required to handle the full range of signals that the main amplifier is required to handle, which is preferably achieved by the provision of a high pass filter at the input to the additional amplifier.

In summary, another problem in the prior art is that the reduction in bandwidth of the amplifier in the crossover region increases the phase shift between the input and output when operating in the crossover region. In the crossover region, or in general at a time when the drain current of the output transistors are low, the bandwidth of the amplifier is reduced causing an increased phase shift from input to output.

Embodiments of the invention provide the advantage of reducing phase shift.

The lower the phase shift the better: lowering the phase shift allows bandwidth to be increased. Any reduction in phase shift between input and output is a benefit. The additional amplifier must provide a phase shift which is less than the phase shift of the main amplifier to achieve the advantage.

The overall phase shift is determined by the combined phase shift of the main amplifier and the additional amplifier. The reduced overall phase shift is automatically achieved by combining the outputs of the main amplifier and the additional amplifier. The wider the bandwidth of the overall amplification stage, the lower the phase shift between input and output. This is a direct relationship. The overall reduced phase shift is thus a result of increasing the overall bandwidth in the crossover region by the provision of the additional amplifier: the overall higher bandwidth in the crossover region results in an overall reduced phase shift in the crossover region.

The additional amplifier provides for a higher bandwidth than the main amplifier alone does in the crossover region, by having a smaller device geometry than the main amplifier. This can be achieved, because of the small geometry of the additional amplifier, with the main and additional amplifiers on a single integrated circuit device.

Although embodiments of the invention provide the advantages of: (i) reducing phase shift; and (ii) reducing bias current, these advantages may be independent of each other. In embodiments, one advantage may be achieved without the other. In embodiments, both advantages may be achieved. In embodiments each advantage may be achieved to varying degrees.

The term crossover region is used in the above description to refer to a region of operation for a push-pull arrangement amplifier. The additional amplifier provides benefits in the crossover region of operation. However the additional amplifier may be permanently connected and permanently enabled, as its presence does not degrade performance outside of the crossover region.

Although reference is made herein to the achievement of benefits, utilising the invention, in the crossover region of operation, it will be understood that these benefits may be achieved in regions of operation of the amplifier other than the crossover region. In particular, the benefits of the invention are obtained in any region of operation—or any instant of operation—where the bandwidth of the main amplifier is reduced in comparison to its required or predetermined bandwidth. Overall, the invention avoids the need, as a result of such bandwidth reduction at any time, to fix the bias current of the main amplifier to ensure that should such bandwidth reduction occur, it is not reduced to an extent that operation of the main amplifier is inhibited. This has the benefit also of avoiding an increase in phase shift as a result of a bandwidth reduction. The additional amplifier maintains the required bandwidth such that when the bandwidth of the main amplifier is reduced, signals are processed by the additional amplifier to maintain overall bandwidth performance.

The additional amplifier is preferably configured to provide the same amplitude gain as the main amplifier.

The main amplifier is preferably a power amplifier. The power amplifier is preferably an RF power amplifier.

The bias current of the main amplifier is preferably set in dependence on the bias current required to achieve the desired bandwidth of operation when either the push or pull output transistor of the amplifier is fully turned on.

The bias current of the additional amplifier is preferably set such that the bandwidth of the additional amplifier corresponds to the bandwidth of the main amplifier. The bias current of the additional amplifier is preferably less than that of the main amplifier, due to its reduced geometry.

Figure 8:
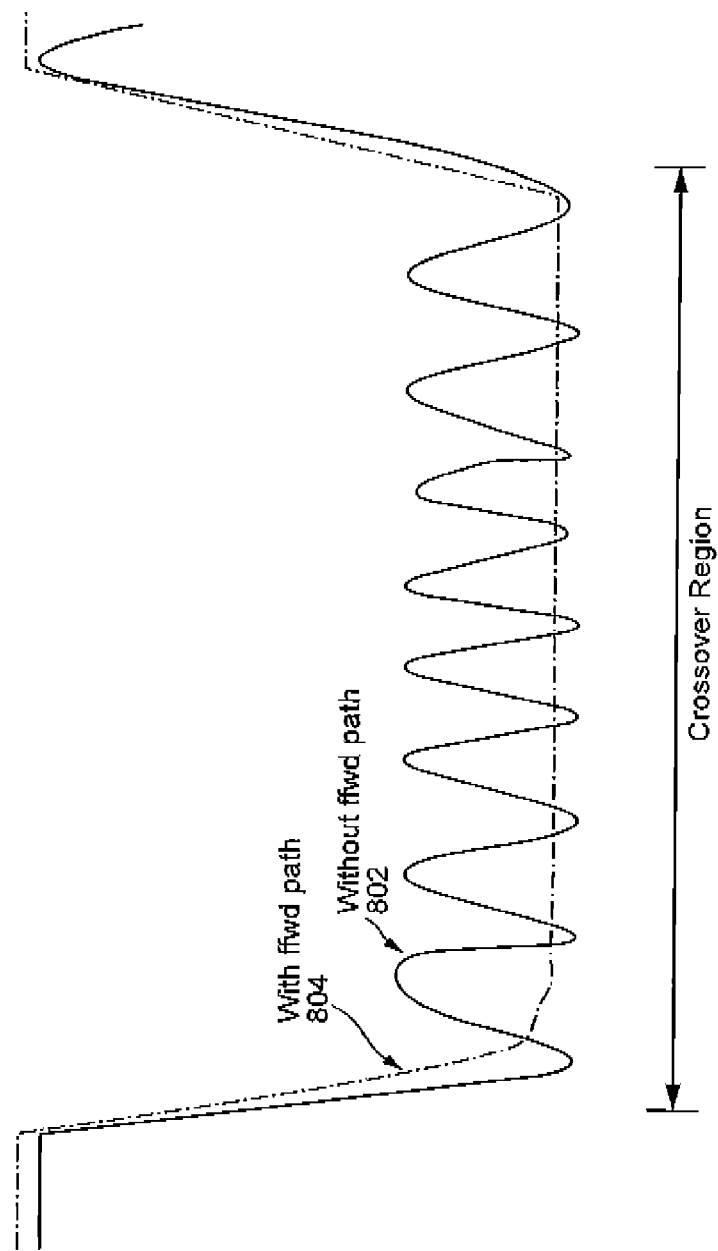
FIG. 8 illustrates the improvement obtained by the exemplary arrangement of the present invention in comparison with the prior art.

FIG. 8 shows the transient response of the amplifier 100 in a closed loop system with and without the additional amplifier. Plot 802 shows the response without the feed-forward path, and plot 804 shows the response with the feed-forward path.

It can be seen that without the feed-forward path a low level oscillation takes place in the crossover region.

A further exemplary practical implementation of the invention is described with reference to an illustration of a problem in FIG. 9, and illustration of a solution to the problem in accordance with an embodiment of the inventive principles in FIG. 10.

Figure 9:
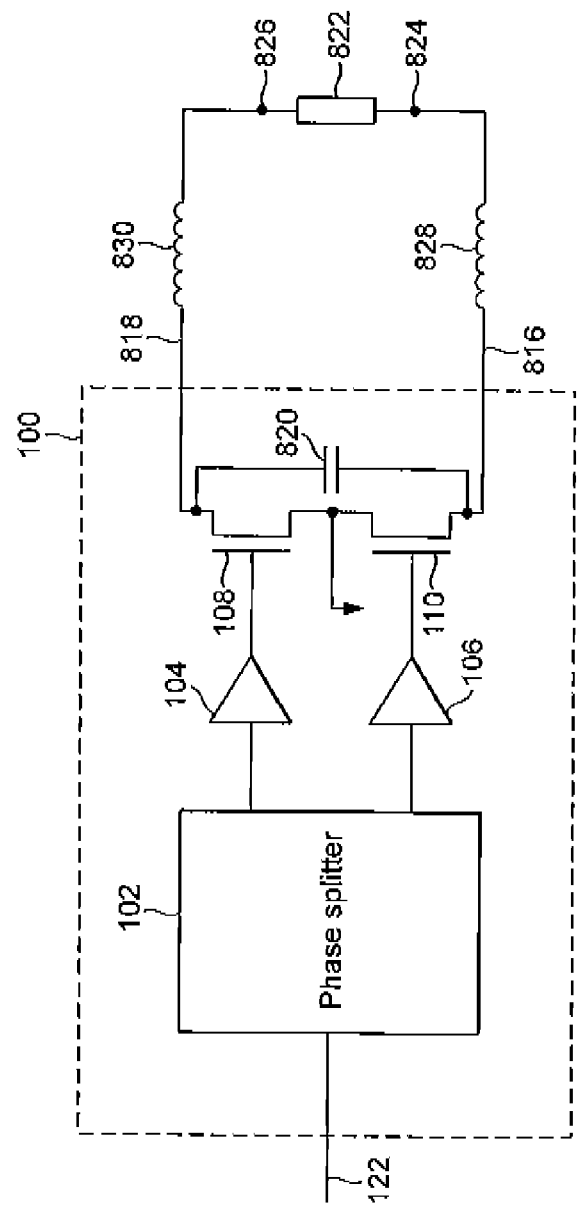
FIG. 9 illustrates the connection of an output amplifier to an off-chip load in the prior art.

FIG. 9 illustrates an amplifier output stage 100, incorporating a push-pull power transistor arrangement including transistors 108 and 110. Each of the power transistors 108 and 110 receives an input from a respective amplifier 104 and 106 at a gate terminal thereof. The amplifiers 104 and 106 each receive a different phase of an input signal on line 122 from a phase splitter 102. This arrangement is consistent with the arrangement of FIG. 1.

The transistors 108 and 110 are arranged differently to the arrangement of FIG. 1 in this embodiment. The source terminals of the transistors 108 and 110 are commonly connected to electrical ground. The drain terminal of the power transistor 108 is connected to an output line 818, and the drain terminal of the power transistor 110 is connected to an output line 816.

A capacitor 820 represents the output capacitance of the power push-pull transistors 108 and 110, connected between the drain terminals on lines 816 and 818. The output capacitor has a capacitance value $C_{out\_large}$.

In a typical implementation, the output of the power push-pull transistors 108 and 110 are connected to drive a load. Typically, the load is provided off-chip. Thus the output of the power push-pull transistors 108 and 110 are connected off-chip to a load. This requires the output of the power push-pull transistors 108 and 110 to be connected through the bond or lead wires of a lead frame of an integrated circuit (IC) package to the load.

In FIG. 9, the load is illustrated as a resistive load 822 having a resistor value $R_{load}$. The connection of the source and drain of the power push-pull transistors 108 and 110 to the terminals of the load is represented in FIG. 9 by the connection of the line 816 to a terminal 824 of the load 822, and the connection of the line 818 to a terminal 826 of the load 822. As shown in FIG. 9, these connections are made via respective inductors 828 and 830. Thus the line 816 is connected to the terminal 824 via inductor 828, and the line 818 is connected to the terminal 826 via inductor 830.

The inductors 828 and 830 represent the inductance of the lead frame connections or bond wires connecting the output of the power push-pull transistors 812 and 813 off-chip. The inductors 828 are assumed for illustrative purposes to be equal, and each have an inductance value denoted $L_{bond}$.

The off-chip connection arrangement of FIG. 9 is a conventional prior art off-chip connection arrangement.

It is well-known in the art that in building high bandwidth, high power feedback amplifiers, the bond wire interface presents a serious limitation. The limitation is caused by the output capacitance $C_{out}$, which forms a lagging complex pole with a natural frequency f defined by:

$$f = \frac{1}{2\pi\sqrt{Lbond * Cout\_large}}$$

Since the power push-pull transistors 108 and 110 are large, the output capacitor is large. This results in a severe reduction in bandwidth in the crossover region when the drain current of the power push-pull transistors 108 and 110 are low. This reduction in bandwidth further increases the phase shift between the input and output of the power push-pull transistors 108 and 110 in the crossover region.

Thus the connections through the bond wires off-chip introduce a further problem in addition to the other problems associated with crossover as discussed above.

With reference to FIG. 10, there is illustrated an improvement to the arrangement of FIG. 9 in accordance with the principles of the invention.

FIG. 10 illustrates an additional output push-pull amplifier arrangement of the output stage 100, incorporating push-pull transistors 862 and 863. The transistor 862 receives an input from the amplifier 104 at a gate terminal thereof. The transistor 863 receives an input from the amplifier 106 at a gate terminal thereof. The source terminals of the transistors 862 and 863 are connected to electrical ground. The drain terminals of the transistors 863 and 862 are respectively connected to respective output lines 866 and 868. A capacitor 870 represents the output capacitor of the push-pull transistors 862 and 863, connected between the drain terminals on lines 866 and 868. The output capacitor has a capacitance value $C_{out\_small}$.

The push-pull transistors 862 and 863 are also connected to the load 822. The connection of the drains of the transistor 862 and 863 to the terminals of the load is represented in FIG. 10 by the connection of the line 866 to the terminal 824 of the load 822, and the connection of the line 868 to the terminal 826 of the load 822. As shown in FIG. 10, these connections are made via respective inductors 878 and 880. Thus the line 866 is connected to the terminal 824 via inductor 878, and the line 868 is connected to the terminal 826 via inductor 880.

The inductors 878 and 880 represent the inductance of the lead frame connections connecting the output of the transistor 862 off-chip. The inductors 878 and 880 are assumed for illustrative purposes to be equal to the inductors 828 and 830, and each have therefore have an inductance value denoted $L_{bond}$.

Thus in accordance with the principles of the invention as discussed above, the push-pull transistors 862 and 863 provide a feed forward path in parallel with the push-pull transistors 108 and 110, to the load 822. As noted, the feed-forward path is not connected to the output of the main path on-chip. The feed-forward path is taken off-chip via separate bond wires, and then connected with the main path off-chip at the printed circuit board (PCB) level.

In accordance with the principles of the present invention, the transistors in the feed-forward path are much smaller than the transistors in the main path. The transistors in the feed forward path may for example be 20 times or more smaller than the transistors in the main path. Consequently the output capacitance of the transistors in the push-pull arrangement in the feed forward path is reduced by a similar scale. This means that the complex pole in the feed forward path is increased, compared to the complex pole in the main path, by the square root of the size ratio.

Thus in the crossover region, when the bandwidth of the power transistors are reduced, the transistors in the feed-forward path take over to provide wideband operation. Thus the overall bandwidth from input to output is not notably reduced, and the phase shift between the input and the output is not notably increased.

In the embodiment of FIG. 10, a feed-forward or additional transistor is provided for each transistor of the push-pull arrangement. However benefits may be obtained by providing a feed-forward or additional transistor for only one half of the push-pull arrangement. Thus only one of transistors 862 and 863 may be provided.

This arrangement also addresses the problems associated with the presence of the bond wires inductors as set out above with respect to FIG. 9.

It should be understood that the invention is not limited to any specific push-pull configuration, not any specific implementation of a push-pull arrangement. Different push-pull arrangements and implementations are described herein to illustrate different preferred embodiment of the invention. However the principles and advantages of all embodiments apply to any push-pull arrangement and a push-pull arrangement for any particular is chosen for illustrative purposes and should not be interpreted as limiting an embodiment to a specific arrangement. For example, all arrangements and embodiments as set out herein apply to a push-pull arrangement where the output transistors generate an output from a common connection of their terminals (as in FIG. 1), or where the output transistors generate an output from their terminals which are not commonly connected (as in FIG. 10).

The present invention has been described herein by way of reference to particular preferred embodiments. However the invention is not limited to such embodiments. The present invention is a particular application in relation to RF amplifiers, but is not limited to such implementations. The invention can be advantageously utilised in any environment where a modulated supply signal should be preferably aligned with another signal.

The described preferred embodiments utilising an RF amplifier are not limited to any particular load being driven by such RF amplifier. However it is envisaged that such an RF amplifier will typically drive an antenna. As such the present invention has particularly advantageous uses in the field of communications, including the field of mobile communications, and particularly in mobile handsets.

What is claimed is:

1. An amplifier arrangement comprising:
a main push-pull amplifier, including a first transistor and a second transistor, and connected to receive an input signal and generate an amplified version of the input signal; and
an additional amplifier, connected to receive the input signal and generate an amplified version thereof;
wherein the outputs of the main amplifier push-pull amplifier including the first and the second transistors and the additional amplifier are combined to provide an amplified output, and
wherein during operation in a crossover region of the main push-pull amplifier including the first and the second transistors, the bandwidth of the additional amplifier is greater than the bandwidth of the main push-pull amplifier including the first and the second transistors.

2. The amplifier arrangement of claim 1, wherein the additional amplifier comprises a push-pull amplifier.

3. The amplifier arrangement of claim 1, wherein during operation in the crossover region of the main push-pull amplifier including the first and the second transistors, the bandwidth of the main push-pull amplifier including the first and the second transistors is reduced compared to the bandwidth of the main push-pull amplifier including the first and the second transistors during operation outside the crossover region.

4. The amplifier arrangement of claim 1, wherein during operation when the bandwidth of the main push-pull amplifier including the first and the second transistors is reduced, the bandwidth of the additional amplifier is greater than the bandwidth of the main push-pull amplifier including the first and the second transistors.

5. The amplifier arrangement of claim 1, wherein during operation when the bandwidth of the main push-pull amplifier including the first and the second transistors is reduced, the bandwidth of the additional amplifier is maintained at a level corresponding to the bandwidth of the main amplifier before the bandwidth of the main amplifier was reduced.

6. The amplifier arrangement of claim 1, wherein the bias current of the main push-pull amplifier including the first and the second transistors is set in dependence on a level of bias current required to provide a required bandwidth outside a crossover region of operation.

7. The amplifier arrangement of claim 1, wherein the bias current of the main push-pull amplifier including the first and the second transistors is set in dependence on a level of bias current to achieve a desired bandwidth of operation with an output transistor of the push or pull side of the amplifier fully turned on.

8. The amplifier arrangement of claim 1, further comprising a high pass filter connected to receive the input signal and provide a high pass filtered version of the input signal as the input to the additional amplifier.

9. The amplifier arrangement of claim 1, wherein the additional amplifier increases the overall bandwidth of the amplifier arrangement, during a period in which the bandwidth of the main push-pull amplifier including the first and the second transistors is reduced, such that the phase shift between the input and the output is reduced relative to the phase shift between the input and output of the main amplifier.

10. The amplifier arrangement of claim 1, wherein the additional amplifier increases the overall bandwidth of the amplifier arrangement, during a period in which the bandwidth of the main push-pull amplifier including the first and the second transistors is reduced, such that the bandwidth of the main push-pull amplifier including the first and the second transistors is reduced relative to the bandwidth of the main push-pull amplifier including the first and the second transistors without the additional amplifier, wherein the bias current of the main push-pull amplifier including the first and the second transistors is reduced relative to the bias current of the main amplifier without the additional amplifier.

11. The amplifier arrangement of claim 1, wherein the main amplifier is a power amplifier.

12. The amplifier arrangement of claim 1, wherein the main push-pull amplifier including the first and the second transistors comprises a current mirror arrangement for driving an output transistor.

13. The amplifier arrangement of claim 1, wherein the main push-pull amplifier including the first and the second transistors and the additional amplifier are provided on an integrated circuit, and the output of each amplifier is connected to a respective bond wire of the integrated circuit.

14. A method of amplifying an input signal comprising:
amplifying the input signal in a main push-pull amplifier including a first transistor and a second transistor, and generating an amplified version of the input signal;
amplifying the input signal in an additional amplifier to generate an amplified version thereof; and
combining the amplified versions of the input signal to provide an amplified output,
wherein during operation in a crossover region of the main push-pull amplifier including the first and the second transistors, the bandwidth of the additional amplifier is greater than the bandwidth of the main push-pull amplifier including the first and the second transistors.

15. The method of claim 14, further comprising the step of providing a bias current for the main push-pull amplifier including the first and the second transistors determined in dependence on a predetermined bandwidth of operation of the main amplifier.

16. The method of claim 15, wherein in any region of operation of the main push-pull amplifier including the first and the second transistors, for the determined bias current, where the bandwidth of operation of the main push-pull amplifier including the first and the second transistors is reduced, the bandwidth of operation of the additional amplifier provides for full bandwidth operation.

17. The method of claim 15 further comprising a bias current for the additional amplifier which is less than the bias current for the main push-pull amplifier including the first and the second transistors, determined in dependence on a predetermined bandwidth of operation for the additional amplifier which corresponds to the bandwidth of operation of the main push-pull amplifier including the first and the second transistors.

18. The method of claim 15, wherein the bias current of the main push-pull amplifier including the first and the second transistors is reduced compared to the bias current required for the main push-pull amplifier including the first and the second transistors if the additional amplifier was not provided.

19. The method of claim 14, wherein the main push-pull amplifier including the first and the second transistors is a push-pull amplifier including complementary output transistors, wherein the bias current is determined in dependence on the bias current required to achieve the predetermined bandwidth with either output transistor turned on.

20. The method of claim 14, wherein the main push-pull amplifier including the first and the second transistors and the additional amplifier are provided on an integrated circuit, the method further comprising connecting the output of each amplifier to a respective bond wire of the integrated for connection off-chip.

* * * * *